United States Patent [19]
Klippel

[11] Patent Number: 5,815,585
[45] Date of Patent: *Sep. 29, 1998

[54] ADAPTIVE ARRANGEMENT FOR CORRECTING THE TRANSFER CHARACTERISTIC OF AN ELECTRODYNAMIC TRANSDUCER WITHOUT ADDITIONAL SENSOR

[76] Inventor: Wolfgang Klippel, 326 Longview Pl., Thousand Oaks, Calif. 91360

[ * ] Notice: The terminal 11 months of this patent as been disclaimed.

[21] Appl. No.: 308,357

[22] Filed: Sep. 19, 1994

[30] Foreign Application Priority Data

Oct. 6, 1993 [DE] Germany ................................. 4334040

[51] Int. Cl.⁶ ...................................................... H04R 3/00
[52] U.S. Cl. .................................. 381/96; 381/98; 381/59
[58] Field of Search ..................................... 381/107, 108, 381/106, 96, 98, 59; 330/279, 129, 278; 333/14

[56] References Cited

U.S. PATENT DOCUMENTS

| | | | |
|---|---|---|---|
| 4,969,195 | 11/1990 | Nolo | 381/96 |
| 5,068,903 | 11/1991 | Walker | 381/96 |
| 5,438,625 | 8/1995 | Klippel | 381/96 |

FOREIGN PATENT DOCUMENTS 0063195  4/1986  Japan ........................................ 381/93

*Primary Examiner*—Curtis Kuntz
*Assistant Examiner*—Minsun Oh

[57] ABSTRACT

An arrangement is provided for converting an electric signal into an acoustic or a mechanic signal comprising a transducer (1) and an electric circuit connected to the terminals of the transducer (1). An adaptive correction filter (3) compensates for linear and nonlinear distortions of the transducer (1) and realizes a desired overall transfer characteristic of the arrangement. An adaptive detector circuit (2) connected between the filter output (7) and the transducer's terminals provides a motional signal of the transducer at output (11) without using an additional mechanic or acoustic sensor. Reference filter (6) and comparator (13) compare the detected motional signal with a desired signal and provide an error signal e(t) for adaptively adjusting both the correction filter (3) and detector circuit (2) to the transducer. This arrangement dispenses from pre-training and copes with nonlinear and changing transducer characteristics.

12 Claims, 5 Drawing Sheets

ADAPTIVE ARRANGEMENT FOR CORRECTING THE TRANSFER CHARACTERISTIC OF AN ELECTRODYNAMIC TRANSDUCER WITHOUT ADDITIONAL SENSOR

CROSS-REFERENCES TO RELATED APPLICATIONS

Reference is made to the following patent applications

U.S. application Ser. No. 07/867,314 filed April 1992 by W. Klippel entitled CORRECTION OF LINEAR TRANSFER CHARACTERISTICS AND REDUCTION OF NONLINEAR DISTORTION FOR ELECTROACOUSTIC TRANSDUCERS.

U.S. application Ser. No. 04/709,391 filed May 30, 1985 by A. Kaizer entitled ARRANGEMENT FOR CONVERTING AN ELECTRIC SIGNAL INTO AN ACOUSTIC SIGNAL OR VICE VERSA AND A NON-LINEAR NETWORK FOR USE IN THE ARRANGEMENT.

Co-pending U.S. application filed September, 1994 by W. Klippel entitled ADAPTIVE FILTER FOR CORRECTING THE TRANSFER CHARACTERISTIC OF ELECTROACOUSTIC TRANSDUCER.

U.K. application Ser. No. GB2,207,323 by D. R. Birt entitled DISPLACEMENT TRANSDUCER FOR USE WITH ELECTRODYNAMIC LOUDSPEAKERS.

and to the other publications

Kaizer, A. J.: Modeling of the Nonlinear Response of an Electrodynamic Loudspeaker by a Volterra Series Expansion, J. Audio Eng. Soc. 35 (1987) 6, p. 421.

Mathews, V. J.: Adaptive Polynomial Filters, IEEE Signal Processing Magazine, pp. 10–26, July (1991).

Klippel, W.: The Mirror filter—a New Basis for Reducing Nonlinear Distortion Reduction and Equalizing Response in Woofer Systems, J. Audio Eng. Soc. 32 (9), pp. 675–691, (1992).

Frank, W. et. al.: Lautsprecherlinearisierung in Echtzeit mit Hilfe digitaler Vorentzerrung, 19. Tagung der Deutschen Arbeitsgemeinschaft für Akustik (DAGA '93), in Proc. Fortschritte der Akustik (1993).

Mills, P. G. L. and Hawksford, M. O. J.: Distortion Reduction in Moving-Coil Loudspeaker Systems Using Current-Drive Technology, J. Audio Eng. Soc. 37 (3), pp. 129–148, 1989

Klaassen, J. A. et. al.: Motional Feedback with Loudspeakers, Philips Tech. Rev., 29 (5), pp. 148–157, 1968.

De Boer, E.: Theory of Motional Feedback, IRE Trans. Audio, pp. 15–21, 1961).

BACKGROUND OF THE INVENTION

1. Field of the Invention

The invention relates to an arrangement for converting an electric signal into an acoustic or a mechanic signal comprising a transducer, an adaptive correction filter with a linear or nonlinear transfer characteristic and a detector circuit. The correction filter compensates the linear and/or nonlinear distortions of the driver and realizes a desired overall transfer characteristic of the arrangement. The detector circuit provides a motional signal of the transducer without using an additional mechanic or acoustic sensor for adjusting the correction filter to the transducer adaptively.

2. Description of the Prior Art

Transducer (loudspeaker, headphones, actuators) produce substantial linear and nonlinear distortions in the output signal. These distortions affect the quality of sound reproduction systems or impair the efficiency of active attenuation systems in professional applications. An electric filter connected to the input terminals of the transducer can compensate these distortions if the filter shows the inverse transfer characteristic of the transducer.

Straightforward linear filters (e.g. FIR-filter, IIR-filter) can compensate for linear distortions of the transducer. Nonlinear filters for compensating for nonlinearities of the transducer were developed by two different approaches:

1. In a generic approach based on nonlinear system theory the relationship between the electric input and the output signal is described by higher-order system functions using the VOLTERRA-series expansion. These system functions can be derived from the lumped parameter equivalent circuit of the transducer as described by Kaizer, A. J.: Modeling of the Nonlinear Response of an Electrodynamic Loudspeaker by a Volterra Series Expansion. J. Audio Eng. Soc. 35 (1987) 6, p. 421 or can be measured directly as described by Frank, W. et. al.: Lautsprecherlinearisierung in Echtzeit mit Hilfe digitaler Vorentzerrung, 19. Tagung der Deutschen Arbeitsgemeinschaft für Akustik (DAGA '93), in Proc. Fortschritte der Akustik. The inverted system functions can be synthesized by linear and nonlinear subsystems or can be implemented in a polynomial filter as shown by Mathews, V. J.: Adaptive Polynomial Filters, IEEE Signal Processing Magazine, pp. 10–26, July (1991)). The generic approach is advantageous for nonlinear mechanisms which can not be modelled completely, e.g. partial vibration of the cone.

2. The alternative approach is based on a complete modeling of the nonlinear mechanisms in transducers. A special transducer orientated filter structure can be derived from the nonlinear differential equation as described by Klippel, W.: The Mirror filter—a New Basis for Reducing Nonlinear Distortion Reduction and Equalizing Response in Woofer Systems, J. Audio Eng. Soc. 32 (9), pp. 675–691, (1992). This filter comprises a minimum of linear and nonlinear subsystems and can be easily implemented in digital signal processors at low costs.

It is advantageous to make the correction filter adaptive as disclosed in the co-pending U.S patent application by W. Klippel entitled ADAPTIVE FILTER FOR CORRECTING THE TRANSFER CHARACTERISTIC OF ELECTROACOUSTIC TRANSDUCER. This arrangement allows to determine the filter parameters in the normal operation mode reproducing an audio or other signals without off-line pretraining and adapts on-line for changing transducer characteristics caused by temperature, ageing and so on.

Adaptive correction filters have in addition to the signal input and signal output a control input supplied with an error signal e(t). The error signal is generated by subtracting a signal v(t) sensed at the transducer from a reference signal r(t) provided by an filter with a desired transfer characteristic. The signal v(t) represents a motional signal (displacement, velocity, acceleration) at the transducer or an acoustic signal (sound pressure). These signals can be measured by standard sensors (microphone, accelerometer, Laser-displacement meter) which are expensive and impractical in many applications.

Special sensors for sensing a motional signal at loudspeakers were developed for feedback control systems as described by Klaassen, J. A. et. al.: Motional Feedback with Loudspeakers, Philips Tech. Rev., 29 (5), pp. 148–157, 1968. An inexpensive capacitive DISPLACEMENT TRANSDUCER FOR USE WITH ELECTRODYNAMIC LOUDSPEAKERS were disclosed by D. R. Birt in the UK-Patent application Ser. No. GB2,207,323. Another approach uses parts of the transducer for realizing an inexpensive sensor. An additional sensing coil winded on the voice coil of an electrodynamic loudspeaker provides a signal corresponding to the velocity of the voice coil as described by Mills, P. G. L. and Hawksford, M. O. J.: Distortion Reduction in Moving-Coil Loudspeaker Systems Using Current-Drive Technology, J. Audio Eng. Soc. 37 (3), pp. 129–148, 1989. However, the inhomogeneous magnetic field causes nonlinear distortions in the sensed signal at large displacements of the sensing coil due to force factor variations.

An alternative approach uses the existing voice coil of the loudspeaker as a sensor. The current and voltage at the transducer's terminals allow tho detect the back induced voltage (EMF) which is the product of velocity of the voice coil and the force factor Bl. In a feedback control system for loudspeakers proposed by De Boer, E.: Theory of Motional Feedback, IRE Trans. Audio, pp. 15–21, 1961 the loudspeaker were connected to a bridge circuit to compensate for voice coil resistance and to detect the velocity signal. However, this arrangement has some disadvantages:

- A previous measurement of the voice coil resistance is required to adjust the bridge parameters,
- the inductance of the voice coil increases the electric impedance of the voice coil at higher frequencies and is not considered in the used model,
- the temperature of the voice coil changes the resistance of the voice coil resulting to a maladjustment of the bridge circuit,
- the force factor Bl is not constant but depends on voice coil displacement and produces nonlinear distortions in the sensed signal.

SUMMARY

There is thus a need for a detector circuit which derives a motional signal of the transducer (displacement, velocity, acceleration) by sensing terminal voltage and input current of the transducer only. The motional signal is used for adjusting an adaptive correction filter to compensate for the distortions of the transducer and to produce a desired transfer characteristic of the overall system.

The main purpose of the invention is to omit an additional acoustic or mechanic sensor which is expensive and affects the efficiency of the distortion reduction. A detector circuit is required which dispenses from pre-training and prior measurement of the transducer parameters and copes with nonlinear and changing transducer characteristics.

Another purpose is to use the two existing electric lines which connect the transducer with the amplifier for transferring a motional signal from the transducer back to the adaptive filter. No additional sensing lines are required.

A final purpose is to provide a correction system for transducers which is robust and uses inexpensive hardware elements and signal processing implemented in a DSP-system at low costs.

These objections are reached by connecting a detector circuit between the output of the correction filter and the terminals of the transducer. The detector circuit produces a motional signal (e.g. velocity) of the voice coil by modeling the electric input circuit of the transducer. The detector circuit is adaptive and determines the unknown model parameter (resistance and inductance of the voice coil, force factor Bl) from the sensed motional signal on-line. A nonlinear subsystem compensates for the effect of the displacement varying force factor.

DETAILED DESCRIPTION

Figure 1:
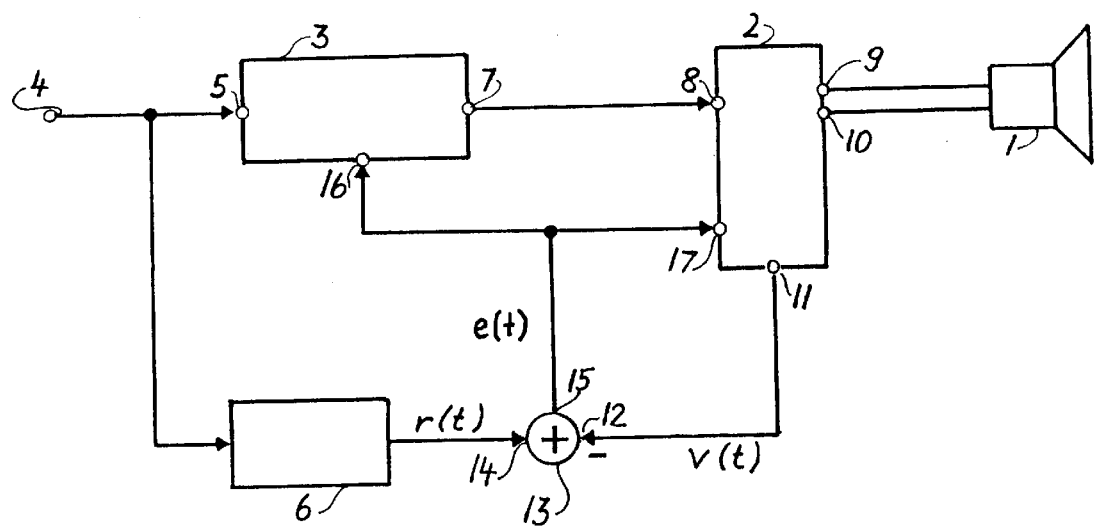
FIG. 1 is a general block diagram of the arrangement.

FIG. 1 shows the general block diagram of the adaptive distortion reduction system for transducers without additional sensor according to the present invention. The arrangement comprises a transducer 1, an adaptive correction filter 3, an adaptive detector circuit 2, a reference filter 6 and a comparator 13. The general input 4, supplying a signal u(t), e.g. an audio signal, is connected with the input 5 of the correction filter 3 and with the input of the reference filter 6. The reference filter shows the desired transfer characteristic of the overall system and provides a reference signal r(t) to the non-inverting input 14 of the comparator 13.

The compensation for linear distortions of the transducer 1 can be accomplished by a linear adaptive filter. To compensate for nonlinear distortions of the transducer 1 a nonlinear adaptive correction filter is required as disclosed in the co-pending U.S patent application by W. Klippel entitled ADAPTIVE FILTER FOR CORRECTING THE TRANSFER CHARACTERISTIC OF ELECTROACOUSTIC TRANSDUCER. The pre-distorted signal at the output 7 of the correction filter 3 is supplied via input 8 and outputs 9, 10 to the electric terminals of the transducer 1.

The detector circuit 2 provides a signal v(t), which corresponds with a motional signal (e.g. velocity) of the voice coil of the transducer 1, for the inverting input 12 of the comparator 13. The error signal $$e(t)=r(t)-v(t) \qquad (1)$$

at the output 15 of the comparator 13 is supplied to the control input 16 of correction filter 3 and to the control input 17 of detector circuit 2 and is used for adaptively adjusting the parameters of both correction filter 3 and detector circuit 2. If the sensed motional signal v(t) corresponds with the reference signal r(t) the error signal e(t) vanishes and the overall system (correction filter with transducer) matches the desired transfer characteristic.

Figure 2:
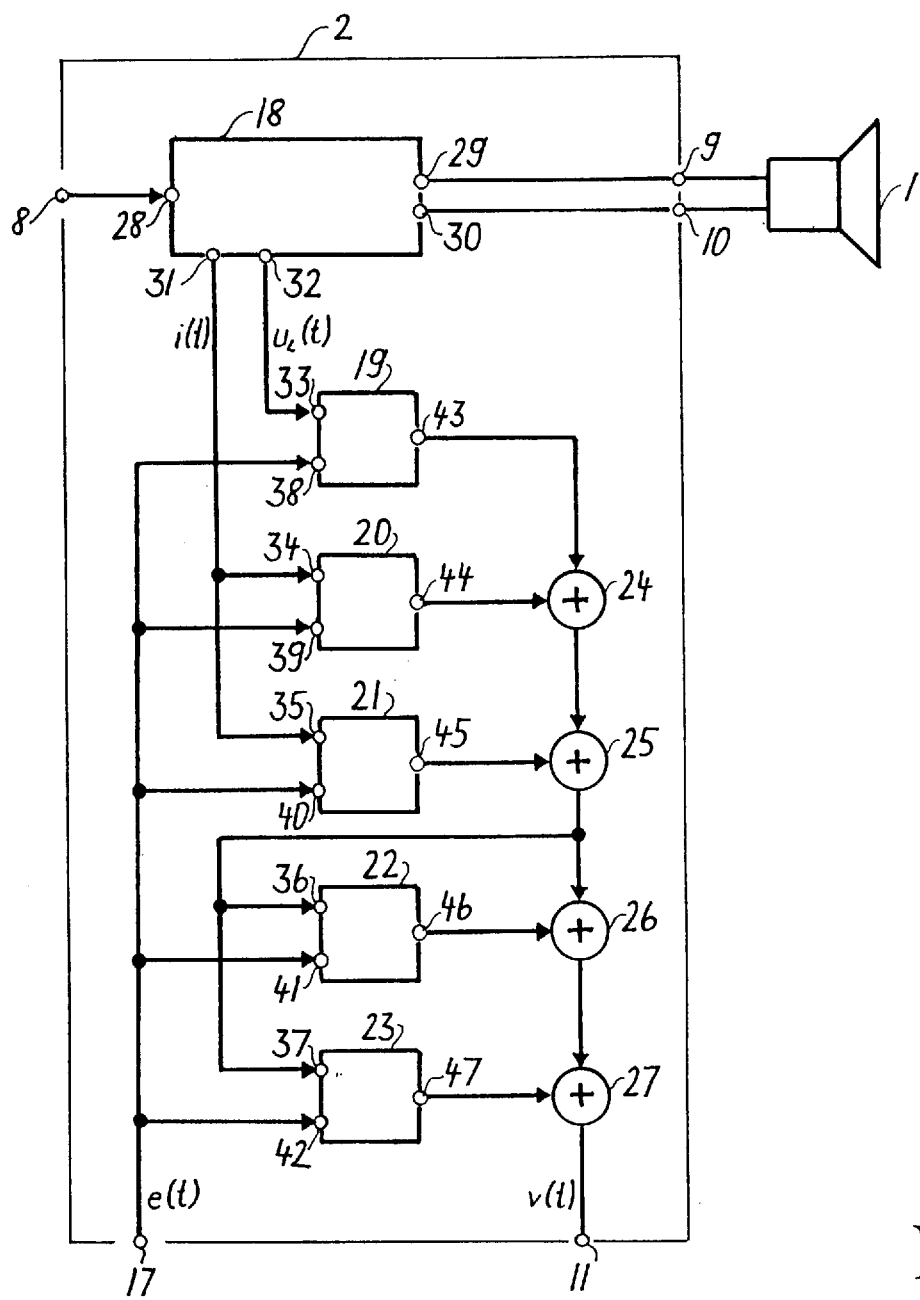
FIG. 2 shows the adaptive detector circuit.

FIG. 2 shows the embodiment of the adaptive detector circuit comprising a sensing circuit 18, adaptive circuits 19, 20, 21, 22, 23 and summers 24, 25, 26, 27.

The sensing circuit 18 has an input 28 provided with the pre-distorted signal from the output 7 of the correction filter.

The outputs 29 and 30 supply the electric signal to the terminals of the transducer 1. The outputs 31 and 32 provide the measured input current i(t) and terminal voltage $U_L(t)$ of the transducer 1.

The circuits 19–23 and the summers 24–27 are used to estimate the motional signal v(t) from both electric signals i(t) and $u_L(t)$. Every circuit 19–23 has one signal input 33–37, one signal output 43–47 and one additional input 38–42 for the error signal. Every summer 24–27 has two signal inputs and one signal output. The structure of the circuits 19–23 and their connection is directly derived from the lumped parameter model of the electrodynamic transducer. The electric input circuit in the lumped parameter model comprises the series connection of the resistance $R_e$, the inductance $L_e$ of the voice coil and the electrodynamic transformer. The electrodynamic transformer is defined by the force factor $B_L(X)$ which depends on the displacement x(t) of the voice coil and couples the back-induced voltage u(t) with the velocity v(t) of the voice coil by the relationship $$u(t) = B_L(x)v(t) \qquad (2)$$

Using Eq. (2) and the relationship $$u_L(t) = R_e i(t) + L_e \frac{di(t)}{dt} + u(t) \qquad (3)$$

of the elements in the electric input circuits lead to the following relationship between velocity v(t) and the electric signals $u_L(t)$ and i(t) at the transducers terminals:

$$v(t) = \frac{1}{B_L(x)} u(t) = \frac{1}{B_L(x)} \left( u_L(t) - R_e i(t) - L_e \frac{di}{dt} \right). \qquad (4)$$

The displacement varying parameter in Eq. (4) can be described by a power series expansion $$\frac{1}{B_L(x)} = n_0 + n_1 x + n_2 x^2 \qquad (5)$$

truncated after the quadratic term.

The displacement x(t) required in Eq. (5) can be provided by a linear filter which performs an integration of the velocity signal $$x(t) = \int v(t) dt \qquad (6)$$

Inserting Eq. (4) in Eq. (6) result in a nonlinear feedback system with some disadvantageous properties. However, the nonlinearity in the transducer is weak and the displacement can be approximated by $$x(t) \approx n_0 \int \left( u(t) - R_e i(t) - L_e \frac{di(t)}{dt} \right) dt \qquad (7)$$

which corresponds with a feed-forward structure.

Inserting Eqs. (5) and (7) in Eq. (4) and introducing the parameters $$r = -R_e n_0 \qquad (8)$$

and $$l = -L_e n_0 \qquad (9)$$

result to $$v(t) = w(t) + n_1 w(t) \int w(t) dt + n_2 w(t) (\int w(t) dt)^2 + \qquad (10)$$

with $$w(t) = n_0 u_L(t) + ri(t) + l \frac{di(t)}{dt}. \qquad (11)$$

Eqs. (10) and (11) show the structure of the required detector circuit. The products of a signal with a time-varying parameter can be realized by controllable amplifiers, the integration and differentiation of signals require linear filters with respective transfer responses, and the summation and multiplication of signals can be realized by summers and multipliers.

Every parameter $n_0$, r, l, $n_1$, $n_2$ in Eqs. (10) and (11) corresponds with one of the adaptive circuits 19–23. Circuit 19 corresponds with the first term on the right side of Eq. (11) and multiplies the terminal voltage $u_L(t)$, supplied from output 32 via input 33 by parameter $n_0$. The circuit 20 corresponds with the effect of the voice coil resistance in the second term in Eq. (11) and multiplies the input current i(t) supplied from output 31 via input 34 by parameter r. The circuit 21 corresponds with the inductance of the voice coil according to the third term in Eq. (11). The current signal i(t) supplied via input 35 from output 31 is first differentiated and then multiplied by parameter l. The signals at the outputs 43, 44, 45 of the circuits 19, 20, 21 are summed up to the signal w(t) by summers 24 and 25.

The signal w(t) at the output of summer 25 is supplied to input 36 of circuit 22, to input 37 of circuit 23 and also to the first input of summer 26. Circuit 22 corresponds with the second term on the right side of Eq. (10) and performs the correction of the asymmetric dependence of force factor on displacement. The signal w(t) is integrated to provide displacement x, then multiplied with w(t) and finally scaled by parameter $n_1$. The third tern on the right side of Eq. (10) compensates the symmetrical dependence of force factor on displacement and is realized by circuit 23. The displacement signal x(t) is squared, then multiplied by w(t) and scaled by parameter $n_2$. The outputs 46 and 47 of the circuits 22 and 23 are connected via the summer 26 and 27 with the output 11 of the detector circuit where the detected velocity signal v(t) is provided for the calculation of the error signal e(t).

Every circuit 19, 20, 21, 22, 23 has one error input 38, 39, 40, 41, 42, connected to the input 17 of the detector circuit to allow an adaptive adjustment of the parameters $n_0$, r, l, $n_1$, $n_2$, respectively.

Figure 3:
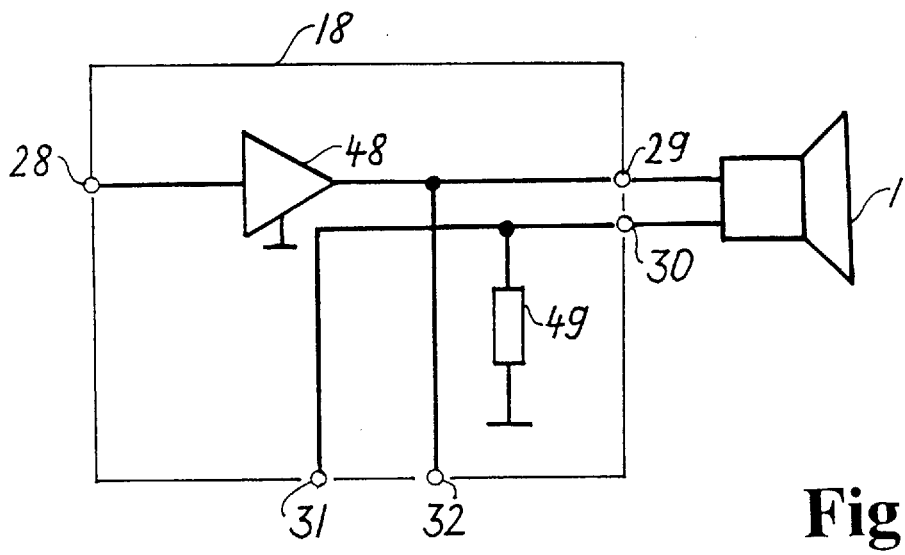
FIG. 3 shows the sensing circuit for measuring the current and voltage at the electric terminals of the transducer.

FIG. 3 shows the sensing circuit 18 for measuring the current i(t) and voltage $u_L(t)$ at the transducer's terminals. The sensing circuit 18 comprises a power amplifier 48 for driving the transducer 1 and a sensing resistor 49 for measuring the input current i(t). The asymmetrical output of the amplifier 48 is connected with one terminal of the transducer 1 and the other terminal of the transducer 1 is connected via the resistor 49 with the ground of the amplifier 48. The input 28 of the sensing circuit 18 is connected to the signal input of the power amplifier 48. The resistance of the sensing resistor 49 is small in comparison to the electric impedance of the transducer 1 so that the output voltage of the amplifier 48 is approximately equal to the voltage $u_L(t)$ at the terminals and can provided via output 32 to the detector circuit. The voltage over the sensing resistor 49, which corresponds with the input current i(t), is supplied via output 31 to the detector circuit.

Figure 4:
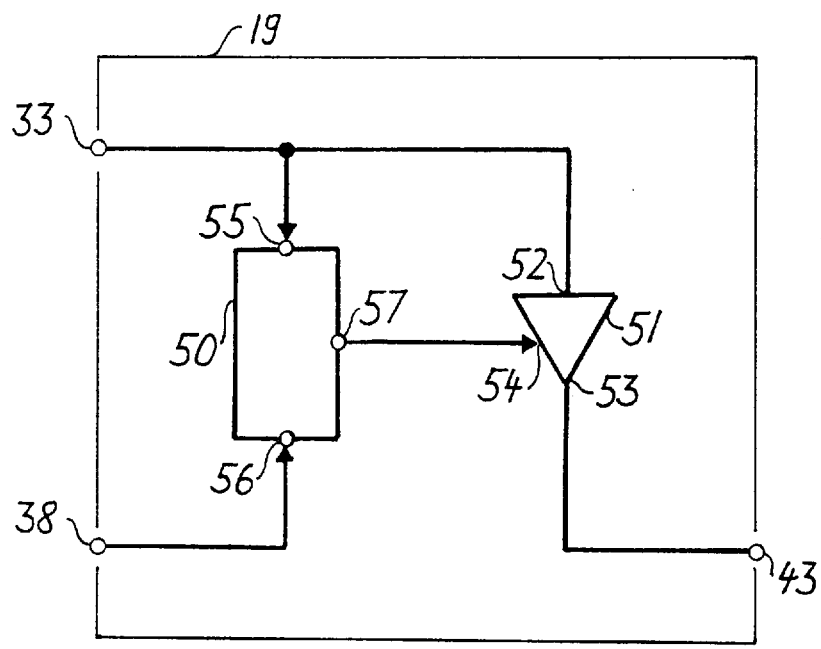
FIG. 4 shows the linear adaptive circuit for compensating the resistance and the constant part of force factor in the detector circuit.

FIG. 4 shows the linear adaptive circuit 19 for compensating for the constant part of the force factor characteristic according to the first term on the right side of Eq. (11). The circuit 19 comprises an update circuit 50 and a controlled amplifier 51. The input 33 providing the voltage $U_L(t)$ is connected both with the first input 55 of the update circuit 50 and via the input 52 and output 53 of the controlled amplifier 51 with the output 43. The error signal e(t) at input 38 is supplied to the other input 56 of the update circuit 50. The signal at the output 57 of the update circuit 50, which corresponds with the value of the instantaneous parameter $n_0$, is supplied to the control input 54 to scale the voltage $u_L(t)$. The adaptive circuit 20 for compensating the resistance according to the second term on the right side of Eq. (11) has the same structure as the adaptive circuit 19.

Figure 5:
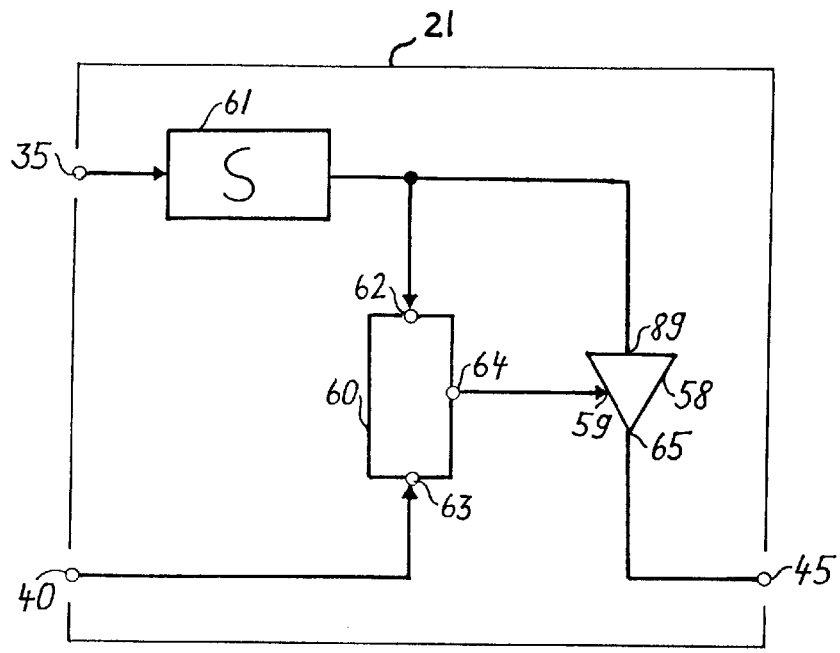
FIG. 5 shows the linear adaptive circuit for compensating the voice coil inductance in the detector circuit.

FIG. 5 shows the linear adaptive circuit 21 for compensating for the voice coil inductance according to the third tern on the right side of Eq. (11). Circuit 21 comprises a differentiator 61, an update circuit 60 and a controllable amplifier 58. The input 35 providing the current signal i(t) is connected via the differentiator 61 both to the first input 62 of the update circuit is 60 and via the input 89 and output 65 of the amplifier 58 to the output 45. The input 40 providing the error signal e(t) is connected with the other input 63 of the update circuit 60. The output 64 of the update circuit 60 providing the estimated parameter l is connected with the control input 59 of the amplifier to scale the differentiated current signal.

Figure 6:
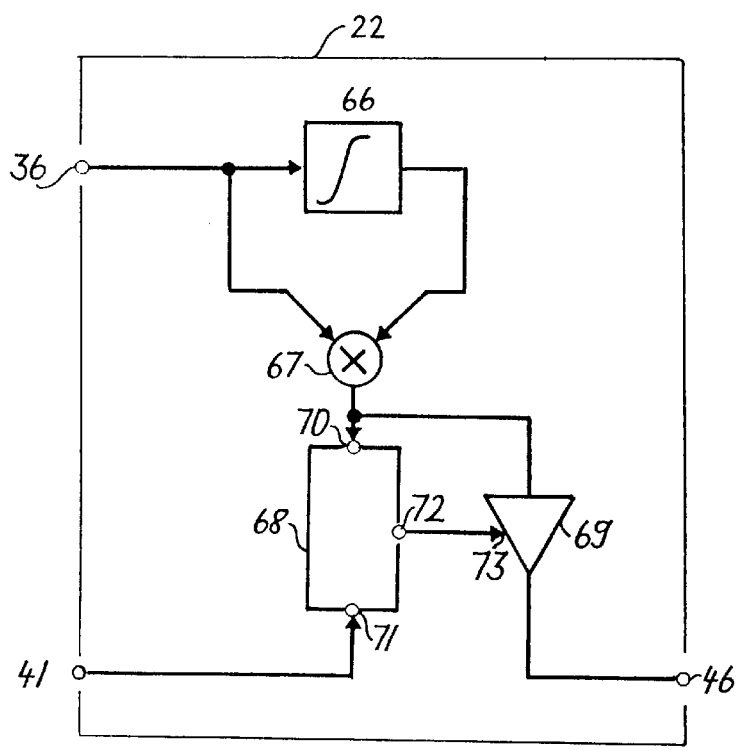
FIG. 6 shows the nonlinear adaptive circuit for compensating the asymmetrical dependence of the force factor on displacement.

FIG. 6 shows the nonlinear adaptive circuit 22 for compensating for the asymmetrical dependence of the force factor on displacement according to the second term on the right side of Eq. (10). Circuit 22 comprises an integrator 66, a multiplier 67, an update circuit 68 and a controllable amplifier 69. The input 36 providing the signal w(t) according Eq. (11) is connected both with the first input of multiplier 67 and via the integrator 66 with the second input of the multiplier 67. The output of the multiplier 67 is connected both to the first input 70 of the update circuit 68 and via the amplifier 69 to the output 46 of the circuit 22. The input 41 providing the error signal e(t) is connected to the input 71 of the update circuit 68. The output 72 of the update circuit 68 providing a signal related to the instantaneous parameter $n_1$ is connected with the control input 73 of the amplifier 69.

Figure 7:
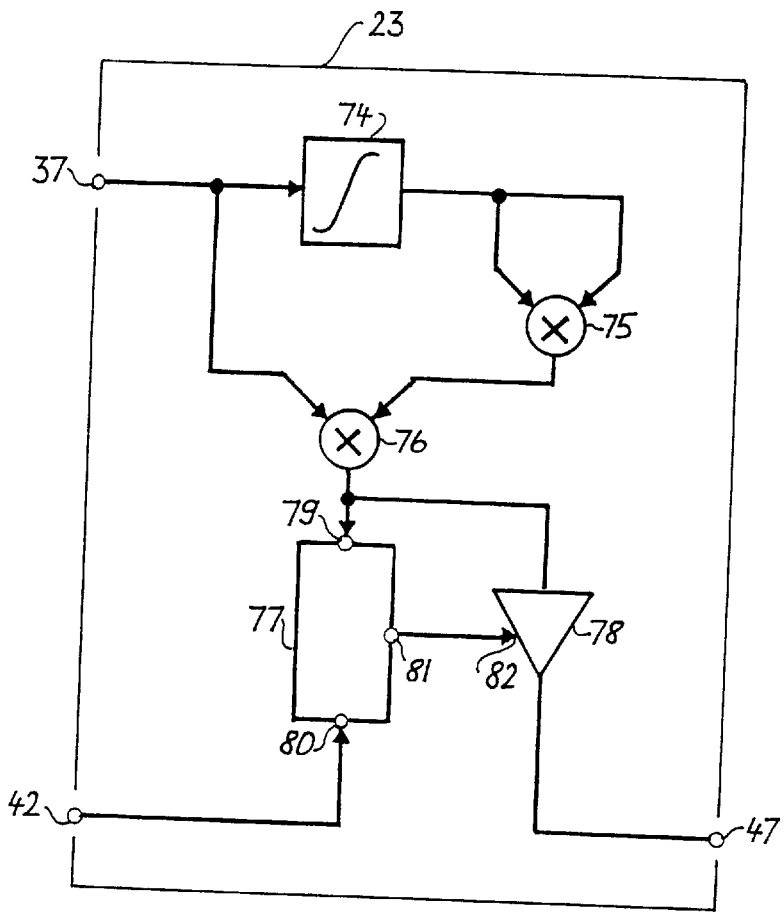
FIG. 7 shows the nonlinear adaptive circuit for compensating the symmetrical dependence of the force factor on displacement.

FIG. 7 shows the nonlinear adaptive circuit 23 for compensating for the symmetrical dependence of the force factor according to the third term on the right side of Eq. (10). Circuit 23 comprises an integrator 74, a squarer 75, a multiplier 76, an update circuit 77 and a controllable amplifier 78. The input 37 providing the signal w(t) according Eq. (11) is connected both with the first input of multiplier 76 and via the integrator 74 and a post-connected squarer 75 with the second input of the multiplier 76. The output of multiplier 76 is connected both to the first input 79 of the update circuit 77 and via the amplifier 78 to the output 47 of the circuit 23. The input 42 providing the error signal e(t) is connected to the input 80 of the update circuit 77. The output 81 of the update circuit 77 providing a signal related to parameter $n_2$ is connected to the control input 82 of the amplifier 78.

Figure 8:
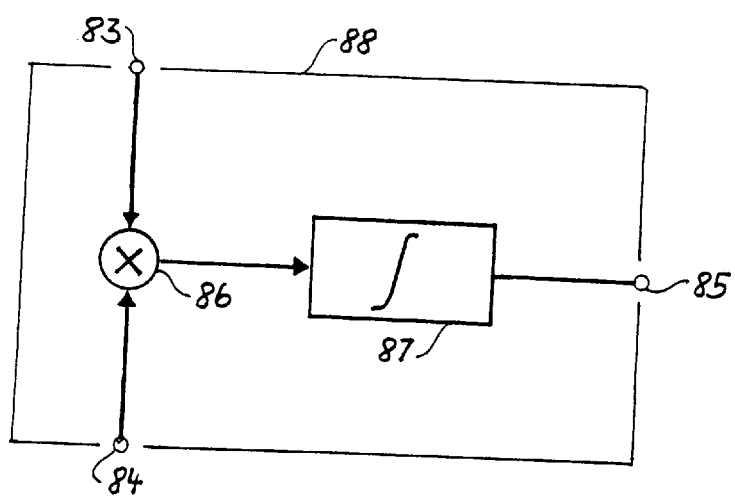
FIG. 8 Adaptive circuit based on a LMS-algorithm for updating the parameters of the detector circuit.

FIG. 8 shows the update circuit 88 which has the same structure as the other update circuits 50, 60, 68, 77. Using a straightforward LMS-algorithm the circuit 88 comprises a multiplier 86 and an integrator or a filter with a low-pass-characteristic 87 for updating the parameters of the detector circuit. The input 83 which corresponds with the inputs 55, 62, 70, 79 is connected with the first input of the multiplier 86. The other input 84 which corresponds with the inputs 56, 63, 71, 80 is connected with the other input of the multiplier 86. The output of the multiplier 86 is connected via integrator 87 with the output 85 which corresponds with the outputs 57, 64, 72, 81.

Finally, the interplay of the different elements in the arrangement is outlined. Connecting a transducer 1 to the outputs 9 and 10 both the correction filter 3 and the detector circuit 2 are not adjusted to the transducer 1. Supplying a signal to the input 4 the detected velocity signal v(t) does not correspond with the desired signal r(t) provided by the reference filter 6 and generates an error signal e(t) in comparator 13. The error signal e(t) is used for adjusting both the correction filter 16 and the detector circuit 2 adaptively. If the amplitude of the error signal reaches a minimal value the optimal filter parameters and the optimal detector parameters $n_0$, r, l, $n_1$, $n_2$ are determined.

The above description shall not be construed as limiting the ways in which this invention may be practiced but shall be inclusive of many other variations that do not depart from the broad interest and intent of the invention.

What is claimed is:

1. An arrangement for converting an electric signal into a mechanic or an acoustic signal using a transducer and an adaptive correction filter having a filter input, a filter output and a control input for compensating for distortions of said transducer and for realizing a desired transfer characteristic between the input of said correction filter and the output of said transducer and for adjusting said correction filter adaptively without using a mechanic or an acoustic sensor, comprising:

an adaptive detector circuit having a detector input connected to said filter output, two transducer outputs connected to the terminals of said transducer, an error input and a detector output for providing a motional signal related to the vibration of said transducer;

a reference filter having a reference input connected to said filter input, a reference output for providing a desired signal related to said desired transfer characteristic; and a comparator having a first input connected to said detector output, a second input connected to said reference output and an output connected both to said control input and to said error input for providing an error signal for adjusting adaptively the parameters of both said correction filter and said detector circuit.

2. The invention according to claim 1 wherein said detector circuit contains:

a sensing circuit having an input connected with said detector input, two outputs connected to said transducer outputs, a voltage output and a current output for measuring the electric signals at the terminals of said transducer;

more than one parameter circuit having a first input, a second input connected to said error input and an output for modeling the effect of lumped parameters in said transducer adaptively; and at least one summer having inputs and an output.

3. The invention according to claim 2 wherein said parameter circuit contains an update circuit having a gradient input, an input connected to said error input and an update output for providing a signal related to the estimated transducer parameter.

4. The invention according to claim 3 wherein:

said first input of one said parameter circuit for compensating for constant force factor is connected to said voltage output;

said first input of at least one said parameter circuit for compensating for another linear transducer parameter is connected to said current output; and the output of said parameter circuit for compensating for constant force factor and the output of every said parameter circuit for compensating for another linear transducer parameter are connected to a separate input of a first said summer.

5. The invention according to claim 4 wherein the output of said first summer is connected to said detector output for providing said motional signal.

6. The invention according to claim 4 wherein:

said parameter circuit for compensating for nonlinear transducer parameter have a nonlinear transfer characteristic between said first input and the output of said parameter circuit;

said first input of all said parameter circuit for compensating for nonlinear transducer parameter is connected to the output of said first summer;

the output of said first summer and the output of every said parameter circuit for compensating nonlinear transducer parameter are connected to a separate input of a second said summer; and the output of said second summer is connected to said detector output for providing said motional signal.

7. The invention according to claim 4 wherein:

said parameter circuit for compensating for constant force factor or for voice coil resistance also contains a controllable amplifier having an input connected with said first input of said parameter circuit, an output connected with the output of said parameter circuit and an amplifier control input connected to said update output for controlling the gain of said amplifier; and said first input being also connected to said gradient input.

8. The invention according to claim 4 wherein said parameter circuit for compensating for voice coil inductance also contains:

a differentiator having an input connected to said first input of said parameter circuit and a differentiator output for providing the differentiated the input current; and a controllable amplifier having an input connected with said differentiator output, an output connected with the output of said parameter circuit and an amplifier control input connected to said update output for controlling the gain of said amplifier; said differentiator output being also connected to said gradient input.

9. The invention according to claim 6 wherein said parameter circuit for compensating for asymmetric force factor dependence also contains:

an integrator having an input connected to said first input of said parameter circuit and an integrator output for providing a signal related to the displacement of the voice coil; and a controllable amplifier having an input connected with said integrator output, an output connected with the output of said parameter circuit and an amplifier control input connected to said update output for controlling the gain of said amplifier, said integrator output being also connected to said gradient input.

10. The invention according to claim 6 wherein said parameter circuit for compensating for symmetric force factor dependence also contains:

an integrator having an input connected to said first input of said parameter circuit and an integrator output for providing a signal related to the displacement of the voice coil;

a squarer having an input connected to said integrator output and a squarer output for providing the squared displacement signal; and a controllable amplifier having an input connected with said squarer output, an output connected with the output of said nonlinear parameter circuit and an amplifier control input connected to said update output for controlling the gain of said amplifier, said squarer output being also connected to said gradient input.

11. The invention according to claim 3 wherein said update circuit comprises:

a multiplier having an input connected to said gradient input, a second input connected to the other input of said update circuit and a multiplier output for multiplying the input signal of said controllable amplifier with said error signal; and an integrator having an input connected to said multiplier output and an output connected to the output of said update circuit for updating the parameter adaptively according to a LMS algorithm.

12. The invention according to claim 2 wherein said sensing circuit comprises:

an amplifier having a signal input connected to the input of said sensing circuit and a output for supplying an electric signal to said transducer; and a resistor connected in series with the transducer's terminals for providing a signal related to the input current of said transducer to said current output.

* * * * *